(12) United States Patent
Stefano et al.

(10) Patent No.: US 6,570,101 B2
(45) Date of Patent: May 27, 2003

(54) LEAD CONFIGURATIONS

(75) Inventors: Thomas Di Stefano, Monte Sereno, CA (US); John W. Smith, Palo Alto, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/858,847

(22) Filed: May 16, 2001

(65) Prior Publication Data

US 2001/0019905 A1 Sep. 6, 2001

Related U.S. Application Data

(62) Division of application No. 09/388,718, filed on Sep. 2, 1999, now Pat. No. 6,420,661, which is a division of application No. 08/712,855, filed on Sep. 12, 1996, now Pat. No. 6,191,368.
(60) Provisional application No. 60/003,619, filed on Sep. 12, 1995.

(51) Int. Cl.[7] .......................... H01R 12/04; H05K 1/11
(52) U.S. Cl. ....................................... 174/261; 361/776
(58) Field of Search ................................ 174/260–261; 361/772–776

(56) References Cited

U.S. PATENT DOCUMENTS

| | | | |
|---|---|---|---|
| 3,842,189 A | 10/1974 | Southgate | 174/52.3 |
| 4,893,172 A | 1/1990 | Matsumoto et al. | 357/79 |
| 5,025,307 A | 6/1991 | Ueda et al. | 257/696 |
| 5,148,265 A | 9/1992 | Khandros et al. | 357/80 |
| 5,148,266 A | 9/1992 | Khandros et al. | 357/80 |
| 5,228,861 A | 7/1993 | Grabbe | 439/66 |
| 5,430,614 A | 7/1995 | Difrancesco | 361/785 |
| 5,430,616 A | 7/1995 | Katsu et al. | 174/261 |
| 5,455,390 A | 10/1995 | DiStefano et al. | 174/262 |
| 5,505,565 A | 4/1996 | Canales | 257/777 |
| 5,518,964 A | 5/1996 | DiStefano et al. | 437/209 |
| 5,552,963 A | 9/1996 | Burns | 361/735 |
| 5,557,501 A | 9/1996 | DiStefano et al. | 361/704 |
| 5,610,436 A | 3/1997 | Sponaugle et al. | 257/669 |

Primary Examiner—Albert W. Paladini
Assistant Examiner—Jeremy Norris
(74) Attorney, Agent, or Firm—Lerner, David, Littenberg, Krumholz & Mentlik, LLP

(57) ABSTRACT

A microelectronic lead element includes an elongated first leg having a surface releasably attached to a substrate. The first leg has a tip end and a base end. An elongated second leg includes a surface releasably attached to a substrate, the second leg having a tip end and a base end. The base end of the first leg is arranged adjacent the base end of the second leg. A body of conductive material is adapted for electrically connecting the base ends of the first and second legs together. The first and second legs extend away from their respective base ends and said body of conductive material in a common direction. Movement of the tip ends relative to each other in a vertical direction relative to the substrate causes flexure of the first and second legs in opposite directions upon release from the substrate.

32 Claims, 4 Drawing Sheets

LEAD CONFIGURATIONS

CROSS-REFERENCE TO RELATED APPLICATIONS

The present application is a division of Ser. No. 09/388,718 and claims benefit of U.S. Pat. No. 6,420,661, filed Sep. 2, 1999 which is a Division of Ser. No. 08/712,855, filed Sep. 12, 1996 and claims the benefit of U.S. Pat. No. 6,191,368 which claims the benefit of U.S. Provisional Application No. 60/003,619, filed Sep. 12, 1995.

BACKGROUND OF THE INVENTION

The present invention relates to mounting and connection devices for use with microelectronic elements such as semiconductor chips.

Complex microelectronic devices such as modern semiconductor chips require numerous connections to other electronic components. For example, a complex microprocessor chip may require hundreds of connections to external devices.

Semiconductor chips have commonly been connected to electrical traces on mounting substrates using several alternative methods, including wire bonding, tape automated bonding and flip-chip bonding. Each of these techniques presents various problems including difficulty in testing the chip after bonding, long lead lengths, large areas occupied by the chip on the microelectronic assembly, and fatigue of the connections due to changes in the sizes of the chip and the substrate under thermal expansion and contraction.

Structures that have been used to successfully address the foregoing problems are disclosed in commonly assigned U.S. Pat. Nos. 5,148,265; 5,148,266; and 5,455,390. Structures according to the embodiments taught in these patents comprise a flexible, sheet-like element having a plurality of terminals disposed thereon. Flexible leads are used to connect the terminals with contacts on a first microelectronic element such as an integrated circuit. The terminals may then be used to test the microelectronic chip, and may be subsequently bonded to a second microelectronic element. The flexible leads permit thermal expansion of various components without inducing stresses in the connection.

Commonly assigned U.S. Pat. No. 5,518,964 ("the '964 patent"), hereby incorporated in its entirety herein, discloses further improvements in microelectronic connections. In certain embodiments of the '964 patent, a flexible, sheet-like element has a first surface with a plurality of elongated, flexible leads extending from a terminal end attached to the sheet-like element to a tip end offset from the terminal end in a preselected, first horizontal direction parallel to the sheet-like element. The tip ends have bond pads for connection to a microelectronic element. As the term is used herein, "microelectronic element" encompasses circuit boards, integrated circuits, connection components such as polyimide or other dielectric sheets, and other components used in microelectronic circuitry. Each of the plurality of leads is simultaneously formed by moving all of the tip ends of the leads relative to the terminal ends thereof so as to bend the tip ends away from the sheet-like element. This is accomplished by relative movement between the sheet-like element and the microelectronic element.

The tip ends of the leads are initially attached to the sheet-like element. The initial position of the bond pad on the tip ends is thereby fixed with respect to the terminal ends in order to facilitate attachment to the microelectronic element.

Various lead configurations are disclosed in the '964 patent. In one such configuration, the leads comprise straight, elongated bodies of conductive material extending between terminal ends connected to a dielectric sheet-like element and tip ends to be connected to a microelectronic element. The terminal end of the lead is attached through a via in the sheet-like element to another microelectronic element on the other side of the sheet-like element.

The attachment of the tip ends of the leads to the sheet-like element is releasable. After bonding the tip ends to the microelectronic element, the leads are formed in their final configuration by moving the sheet-like element and the microelectronic elements relative to each other in two directions: in a vertical direction away from each other, and in a horizontal direction parallel to the sheet-like element. As a result, the tip end of the lead is separated from the sheet-like element and traces an arcuate path relative to the other end of the lead. That movement prevents stretching of the lead during formation and results in an S-shaped configuration of the lead that is advantageous in absorbing further relative movement between the sheet-like element and the microelectronic element due to thermal expansion/contraction during operation of the resulting device.

In another lead configuration taught in the '964 patent, the lead is initially a curved strip disposed on a surface of the sheet-like element. A terminal end of the lead is connected to a terminal through a via in the sheet-like element and a tip end is bonded to a microelectronic element. In forming those leads to a final configuration, the sheet-like element and the microelectronic element are moved away from each other in a vertical direction only. The curve of the lead is partially straightened by the relative movement of the elements. The "slack" created by the initial curve in the lead permits vertical displacement of the microelectronic components without the necessity of providing additional lead length by horizontally displacing the components.

A number of such configurations of curved leads are disclosed in the '964 patent. An S-shaped lead structure permits nesting of adjacent leads in configurations requiring a high lead density. A U-shaped lead configuration permits a larger relative displacement of the microelectronic components in a vertical direction without a corresponding horizontal displacement. Numerous other lead configurations are contemplated in the '964 patent.

Still further improvement in the above-described configurations and processes would be desirable.

SUMMARY OF THE INVENTION

One aspect of the present invention provides a microelectronic lead element for connecting first and second microelectronic elements. The lead element comprises a body section and two strip-like flexible leg sections. Each leg section has a base end connected to the body section and a tip end offset from the body section in a horizontal offset direction. Each tip end is attached to a corresponding one of the two microelectronic elements. The leg sections are substantially parallel to one another so that movement of one of the tip ends with respect to the other in a vertical direction perpendicular to the horizontal offset direction causes flexure of the leg sections in opposite directions relative to the rigid body.

The tip ends may have bonding material thereon facing in opposite vertical directions. The body may be rigid and may have a thickness greater than or the same as the thickness of the leg sections, and the leg sections and the body section may be gold, copper, nickel or similar materials or composites thereof.

A microelectronic assembly is formed by a plurality of such lead elements connecting first and second microelectronic elements having horizontal surfaces facing one another. One tip end of each lead element is connected to one of the microelectronic elements, and a second tip end is connected to the other microelectronic element so that the lead elements electrically interconnect the microelectronic elements. A dielectric sheet may overlie a surface of one of the microelectronic elements, with the rigid body and leg sections of the lead elements have coplanar surfaces releasably attached to the dielectric sheet. The dielectric sheet has a via proximate to one of the tip ends for connection of that tip end to one of the microelectronic elements.

The microelectronic assembly may be processed by moving the first and second microelectronic elements away from one another in a vertical direction to bend the leg sections of the lead elements.

In another aspect of the invention, a microelectronic assembly has first and second microelectronic elements with horizontal surfaces facing one another, and a plurality of lead elements disposed between those surfaces. Each lead element includes two elongated, flexible leads, each lead having a terminal end connected to a horizontal surface of the corresponding microelectronic element, and a tip end movable away from that microelectronic element and offset from the terminal end in a horizontal direction, also referred to herein as the "offset direction." The tip ends of the two flexible leads are in registry and are connected. The terminal ends of the two leads in each of the lead elements may be aligned with one another. Upon movement of the microelectronic elements away from one another, the lead elements deform. The connected tip ends of the leads are pulled away from the microelectronic elements, and may lie approximately midway between the microelectronic elements in the finished assembly.

The offset directions of the two lead elements may be the same. Further, offset directions of different ones of the lead elements may be different from one another. In that case, there may be a substantially equal number of lead elements having opposite offset directions.

The assembly may further comprise a first dielectric sheet overlying the facing surface of the first microelectronic element; a similar dielectric sheet may overlie the facing surface of the second microelectronic element. The leads are releasably attached to the dielectric sheets, and the dielectric sheets have vias near the terminal ends of the leads for connection of the leads to the microelectronic elements.

In another embodiment of the invention, a connector element for connecting first and second microelectronic elements comprises a dielectric sheet with first and second primary surfaces and a plurality of lead elements. Each of those lead elements includes a first elongated, flexible lead overlying the first surface of the dielectric element, and has a terminal end and a tip end offset from the terminal end in a first offset direction. Each lead element also has a second, elongated, flexible lead overlying the second surface of the dielectric sheet. The second lead has a terminal end connected to the terminal end of the first lead and a tip end offset from the terminal end of the second lead in a second offset direction. The tip ends of both leads are releasably attached to the surfaces of the dielectric sheet.

Within each lead element, the terminal ends of the first and second leads may be aligned with one another. Further, a plurality of vias may extend between the primary surfaces of the dielectric sheet, and at least some of the lead elements may have terminal ends of their first and second leads connected to one another through the vias.

Within each lead element, the first and second offset directions may be the same. Furthermore, the first and second offset directions of all the lead elements may be the same. In addition, the amount of offset between the tip ends and the terminal ends in all of the lead elements may be the same.

On at least some of the leads, there may be bonding material on the tip ends facing away from the surface of the dielectric sheet that lead is overlying. The tip ends of the first and second leads in each of the lead elements may be aligned with one another.

In another aspect of the invention, a microelectronic assembly comprises such a connector element in combination with first and second microelectronic elements with horizontal surfaces facing one another. The connector element is disposed between the mutually facing surfaces of the microelectronic elements. The tip end of the first lead of each of the lead elements is connected to the first microelectronic element, and the tip end of the second lead of each of the lead elements is connected to the second microelectronic element. The lead elements thus electrically interconnect the microelectronic elements.

In a method of processing such a microelectronic assembly, the first and second microelectronic elements are moved away from one another in a vertical direction to bend the lead elements and displace the dielectric sheet in a horizontal direction.

These and other objects, features and advantages to the present invention will be more readily apparent from the detailed description of the preferred embodiments set forth below, taken in conjunction with the accompanying drawings.

DETAILED DESCRIPTION OF THE PREFERRED EMBODIMENTS

Figure 1:
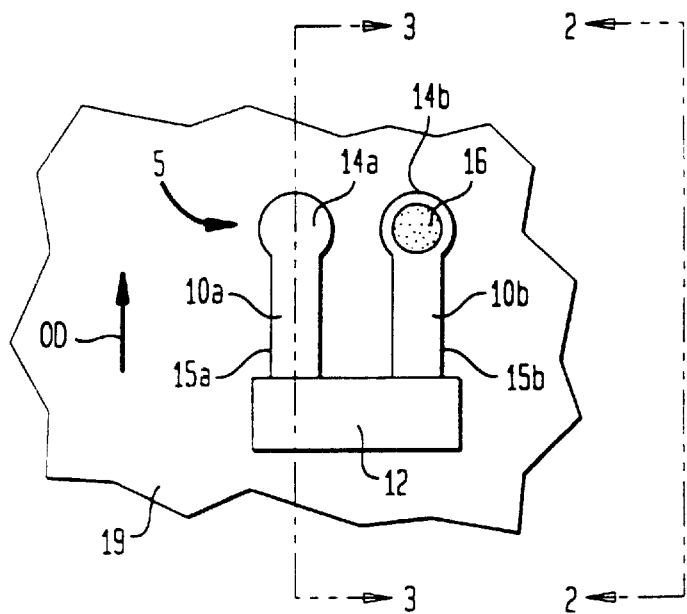
FIG. 1 is a plan view of a microelectronic assembly including a microelectronic lead element according to one embodiment of the invention.

A microelectronic lead element 5 in accordance with one embodiment of the invention (FIG. 1) comprises a relatively thick rigid body section 12 and two relatively thin flexible leg sections 10*a*, 10*b*. Each leg section has a base end 15*a*, 15*b*, and a tip end 14*a*, 14*b*. The base ends are rigidly connected to the body section 12.

The lead element 5 may be formed from a ductile material such as gold, copper, or nickel, or may be formed by deposition or lamination of various layers of those materials. Preferably, the lead element is deposited on or laminated to a dielectric sheet 19 which may be rigid or deformable. Preferably, a flexible polyimide sheet is used. The lead 5 is formed using deposition and/or etching techniques as are known in the art. The lead may alternatively be formed as part of a microelectronic circuit board or formed directly on another microelectronic element.

The tip ends 14*a*, 14*b* may be slightly enlarged to form a generally circular bulge at the end of the leads 10*a*, 10*b*. The tip end 14*b* has an electrically conductive bonding material 16 deposited thereon. One suitable bonding material for use in forming a gold-tin eutectic bond comprises a layer of tin about 10 microns thick and a gold antioxidant layer approximately 2 microns thick over the tin layer. Other bonding materials, such as lead-tin eutectic bonding material or conductive, silver-filled epoxy, may be used, among others. The bonding material 16 is deposited on a surface of the tip end 14*b* facing away from the dielectric sheet 19.

The first leg section 10*a* and second leg section 10*b* are preferably substantially parallel to one another; however, they may be canted at a desired angle if desired. The tip ends 14*a*, 14*b* are offset from the body in offset directions such as offset direction OD by an amount equal to the length of the leg sections 10*a*, 10*b*.

The rigid body section 12 (FIG. 3) has a thickness substantially greater than that of the leg sections 10*a*, 10*b*. As used herein, the term "rigid body" means a body comparatively more rigid than the adjoining elements. The substantially greater thickness of the body section 12 greatly reduces bending of the body section when the leg sections 10*a*, 10*b* are bent during use of the lead element as described below.

The rigid body section 12 may comprise a portion of the lead that is formed integrally with the leg sections. Alternatively, the body section may comprise overlapping extensions of the base ends 15*a*, 15*b* that have been bonded together to form a single, rigid body section 12. In either case, the body section 12 in this embodiment resists bending to a greater extent than the leg sections.

Figure 2:
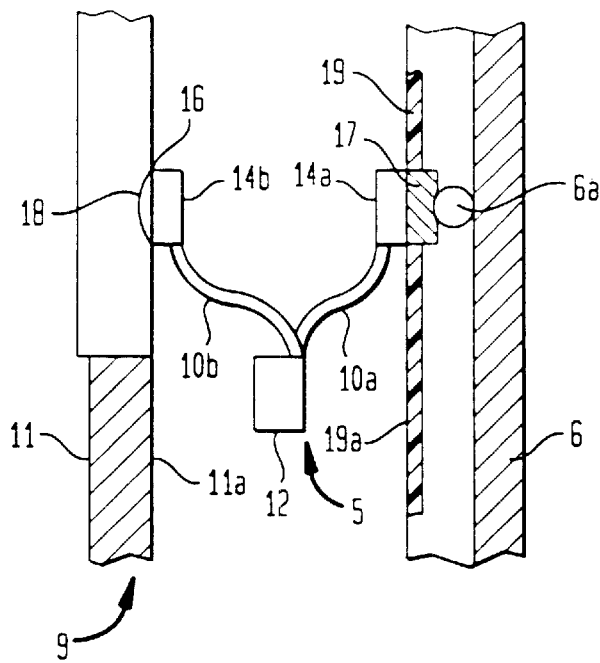
FIG. 2 is a partial cross-sectional view of the microelectronic assembly and lead element shown in FIG. 1.

In one example of the microelectronic element of FIGS. 1 and 2, the legs 10*a*, 10*b* are 15 microns thick and approximately 25 microns wide. If an increased tip end diameter is used, the diameter of the tip ends 14*a*, 14*b* is approximately 35 microns. The rigid body section 12 is approximately 40 microns thick and 75 microns wide. The legs 10*a*, 10*b* are approximately 150 microns long and the tip ends 14*a*, 14*b* may be extended apart approximately 140–150 microns.

The lead element 5 comprises a part of a microelectronic assembly 9 (FIG. 2) according to a further embodiment of the invention. The first tip end 14*a* of the lead element 5 is connected to a first microelectronic element such as a dielectric sheet 19 defining a surface 19*a* of the first microelectronic element. The second tip end 14*b* is connected to a second microelectronic element 11. The first and second microelectronic elements 19, 11 have horizontal facing surfaces 19*a*, 11*a*, respectively. As used herein, the term "horizontal" means a direction parallel to a primary surface of one or both of the microelectronic elements. Tip end 14*a* is positioned over a via 17 in the dielectric sheet 19. The tip end 14*a* is mechanically and electrically connected to a conductive material within the via 17. That conductive material, in turn, may later be connected to a solder ball 6*a* and circuit board 6.

The second tip end 14*b* of the lead element 5 is connected to a contact 18 on the facing surface 11*a* of the second microelectronic element 11, which may be a semiconductor chip. The connection between the tip end 14*b* and the microelectronic element 11 may be made by heating or applying pressure to the bonding material as is known in the art to form a mechanical and electrical bond with contact 18.

Figure 3:
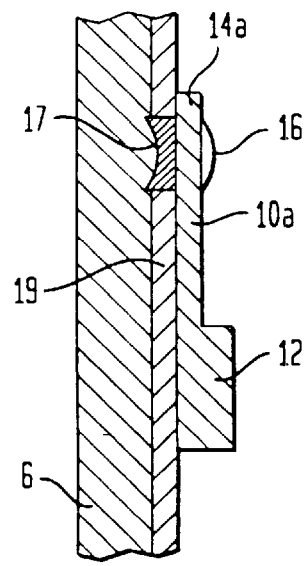
FIG. 3 is another partial cross-sectional view of a microelectronic assembly and lead element shown in FIG. 1.

The rigid body section 12 and the leg sections 10*a*, 10*b* have surfaces that are coplanar when the lead element 5 is in its unextended position (FIG. 3). That configuration may be the result of fabricating the lead element by deposition or lamination techniques on the facing surface 19*a* of the dielectric sheet 19. The first leg section 10*a*, which is bonded at its tip end 14*a* to the conductive material in the via 17, is thereby rigidly attached at its terminal end to the dielectric sheet 19. The second leg section 10*b* and the body section 12 are releasably attached to the dielectric sheet 19. The releasable attachment may result from the adherence of the copper lead element to the dielectric sheet on which it is laminated or deposited. The tip end 14*b* is thereby held in a precise location with respect to the dielectric layer during the bonding process.

In use, the tip end 14*b* of the second leg section 10*b* is bonded to a second microelectronic element 11 such as a semiconductor chip by bringing the bonding material 16 on the tip end 14*b* into contact with a contact 18 on the element 11. The bonding material 16 is then actuated, by heating, pressure or other means, forming a eutectic, conductive adhesive, or other conductive bond.

The microelectronic assembly 9 is further processed by moving the dielectric sheet 19 and the second microelectronic element 11 away from each other in a vertical direction, thereby bending the leg sections 10*a*, 10*b* of the lead element 5. The rigid section 12 remains substantially unbent during this process. The leg sections 10*a*, 10*b* exert substantially equal but opposite moments on the rigid section 12, which therefore remains approximately parallel to the horizontal surfaces 11*a*, 19*a* of the second microelectronic element and the dielectric sheet.

The microelectronic elements 11, 19 may be separated in a vertical direction by means of a mechanical fixture. In one such embodiment, the microelectronic elements are placed in platens having orifices for gripping the elements using vacuum. The platens maintain planarity among the elements, align the tip ends 14*b* with the contacts 18 on the microelectronic element 11, and apply the vertical forces for separating the microelectronic element.

Alternatively, the microelectronic elements 11, 19, may be separated by injecting a pressurized liquid or gas between the facing surfaces 11*a*, 19*a*, forcing the microelectronic elements away from each other and bending the leads. In a preferred embodiment, a curable, liquid encapsulant such as silicone or a flexiblized epoxy is injected between the facing surfaces, separating the microelectronic elements, forming the lead elements 5 and forming a resilient layer of encapsulant between the microelectronic elements after the layer has been cured. The resilient layer seals the region between the microelectronic elements from contaminants, and reduces stresses induced by relative movement of the microelectronic components 11, 19, that would otherwise be transferred to the lead elements 5. In the case where the first microelectronic element 19 comprises a dielectric sheet, the resilient layer further provides a conformable backing for the dielectric sheet. In some embodiments, this compensates for height and flatness errors that would otherwise adversely affect the later bonding of the conductive material in vias 17 to contacts (not shown) in the microelectronic element 6.

Upon relative displacement of the microelectronic elements 11, 19, each of the leg sections 10a, 10b bends in a substantially S-shaped configuration, being restrained at each end. The rigid body section 12 remains substantially unbent and translates in a direction substantially parallel to the facing surfaces 11a, 19a of the microelectronic elements in order to permit displacement of those elements away from each other. As a result, no displacement of the microelectronic elements in the direction of the offset OD (FIG. 1) is necessary. In the final configuration (FIG. 2), the lead elements 5 may deflect in both the horizontal and vertical directions to absorb movement of the microelectronic elements toward and away from each other and relative movement of the microelectronic elements parallel to each other. The resilient layer further supports the leads and spreads the thermocycling forces to better allow the leads to compensate for such movement.

Figure 4:
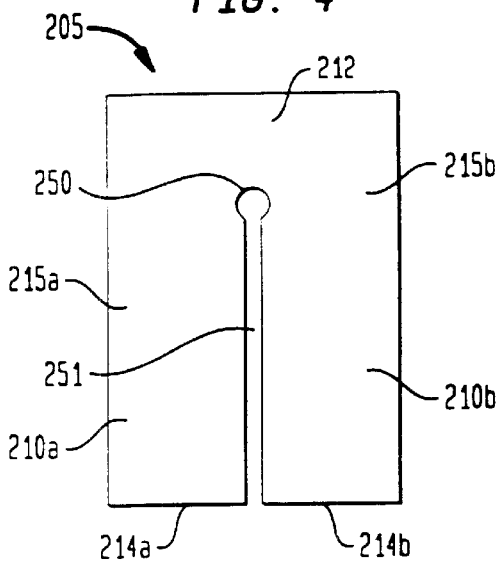
FIG. 4 is a plan view of a lead element according to one embodiment of the invention.

In another embodiment, a microelectronic lead 205 (FIG. 4) comprises a body section 212 and two flexible leg sections 210a, 210b substantially the same thickness as the body section. The lead 205 may be formed by laminating or deposition, followed by etching. The lead may be formed of a ductile material such as gold, copper, nickel or a combination thereof.

The legs 210a, 210b are separated by a slot 251, which terminates adjacent the body section 212. A radius 250 may be formed at the end of the slot 251 in order to relieve stress and prevent tearing during the subsequent forming operation.

Figure 5:
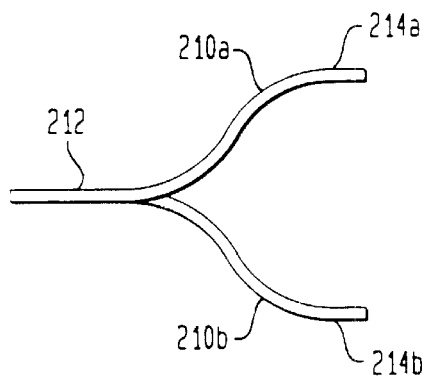
FIG. 5 is a side elevational view of the lead element shown in FIG. 4.

Lead element 205 may comprise part of a microelectronic assembly (not shown) similar to microelectronic assembly 9 (FIG. 2). The tip ends 214a, 214b of the lead 205 are attached to respective microelectronic elements (not shown). The microelectronic elements are then displaced in a vertical direction, bending the leads 210a, 210b (FIG. 5). The radius 250 (FIG. 4) reduces the stress concentration where the legs 210a, 210b meet the body 212.

Figure 6:
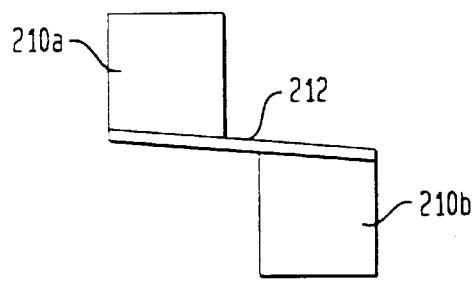
FIG. 6 is a front elevational view of the lead element shown in FIG. 4.

The body 212 may cant slightly (FIG. 6). The body will bend only minimally, however, because bending of the legs at the base ends 215a, 215b (FIG. 4) in a direction perpendicular to the legs prevents the body 212 from bending in a direction parallel to the legs.

The tip ends 214a, 214b may be provided with bonding material (not shown) as described above, for attachment to the respective microelectronic elements. As the legs 210a, 210b are deformed, the body section 212 remains at a position approximately midway between the tip ends 14a, 14b in the vertical direction.

Figure 7:
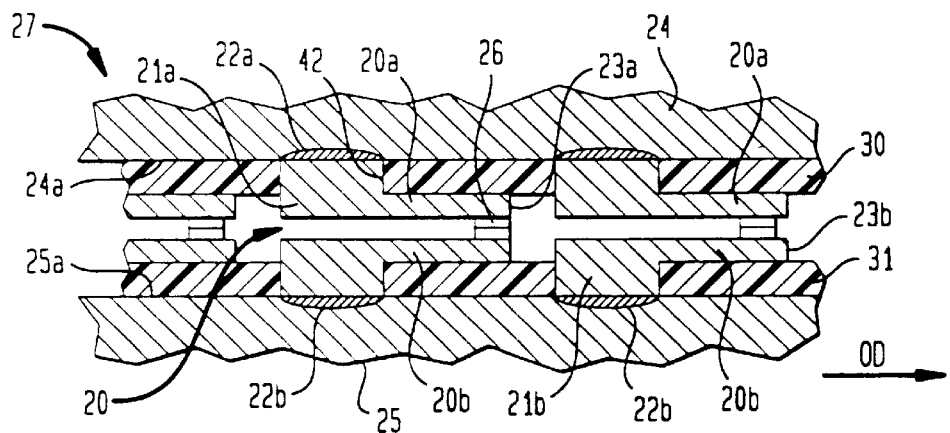
FIG. 7 is a partial cross-sectional view of a microelectronic assembly according to one embodiment of the invention.

In another embodiment of the invention, a microelectronic assembly 27 (FIG. 7) comprises first and second flexible leads 20a, 20b disposed between first and second microelectronic elements 24, 25 having horizontal facing surfaces 24a, 25a, respectively. The first elongated, flexible lead 20a has a terminal end 21a connected to a contact 22a on the first microelectronic element 24 such as a semiconductor chip, a wafer or a connection component. The lead 20a may be formed directly on the facing surface 24a of the microelectronic element 24.

On the opposite end of the strip-like lead 20a is a tip end 23a releasably attached to the microelectronic element 24. The tip end 23a is offset from the terminal end 21a in a horizontal offset direction OD.

A second lead 20b is located on a second microelectronic element 25. The second lead 20b is in registry with the first lead 20a, and has a terminal end 21b and a tip end 23b in registry with the corresponding elements of the first lead 20a. The second lead 20b may be formed directly on the facing surface 25a of the second microelectronic element 25 with the terminal end 21b connected to a contact 22b on the second microelectronic element 25.

In a preferred embodiment, the tip ends 23a, 23b of the first and second leads 20a, 20b, are releasably attached to first and second dielectric sheets 30, 31, which overlie the horizontal facing surfaces 24a, 25a, respectively. In this embodiment, the terminal ends 21a, 21b of the leads 20a, 20b are located over vias 42 in the dielectric sheets 30, 31. The vias contain conductive material connecting the terminal ends 21a, 21b to the contacts 22a, 22b of the microelectronic components 24, 25 respectively.

One or both of the tip ends 23a, 23b are coated with a bonding material 26 on the tip end surface facing away from the associated microelectronic element. The tip ends 23a, 23b are connected by bringing into contact the tip ends 23a, 23b, and bonding material 26, and actuating the bonding material by heat, pressure or other means. The tip ends 23a, 23b are thereby bonded together to form a lead element 20 comprising the two leads. The attachment of each tip end to its respective microelectronic component or dielectric sheet prevents the tip ends from moving during the bonding process. Thus, numerous leads may be provided on each microelectronic element, so that many lead elements are formed in a single bonding operation.

Figure 8:
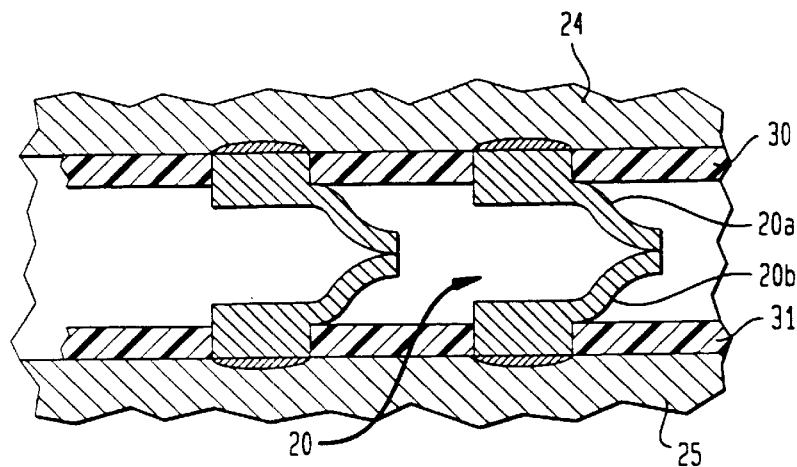
FIG. 8 is a partial cross-sectional view of the microelectronic assembly of FIG. 7 after performing a method for processing the same.

The microelectronic assembly 27 is further processed by displacing the microelectronic elements 24, 25 away from each other in a vertical direction perpendicular to the direction of offset OD and perpendicular to the facing surfaces 24a, 25a. The vertical movement of the microelectronic elements causes the leads 20a, 20b to bend (FIG. 8) and separate from their removable attachment, such as is disclosed in the '964 patent and further disclosed in U.S. patent application Ser. No. 08/547,170, filed Oct. 24, 1995, which is hereby incorporated by reference herein. The lead elements 20, comprising the leads 20a, 20b, now form a flexible connection between the microelectronic elements 24, 25, permitting some relative movement between the components, for example due to thermal expansion. The microelectronic elements 24, 25 may be separated in the vertical direction either by means of a mechanical fixture or by injecting a pressurized liquid or gas between the facing surfaces 24a, 25a, as described above.

Figure 9:
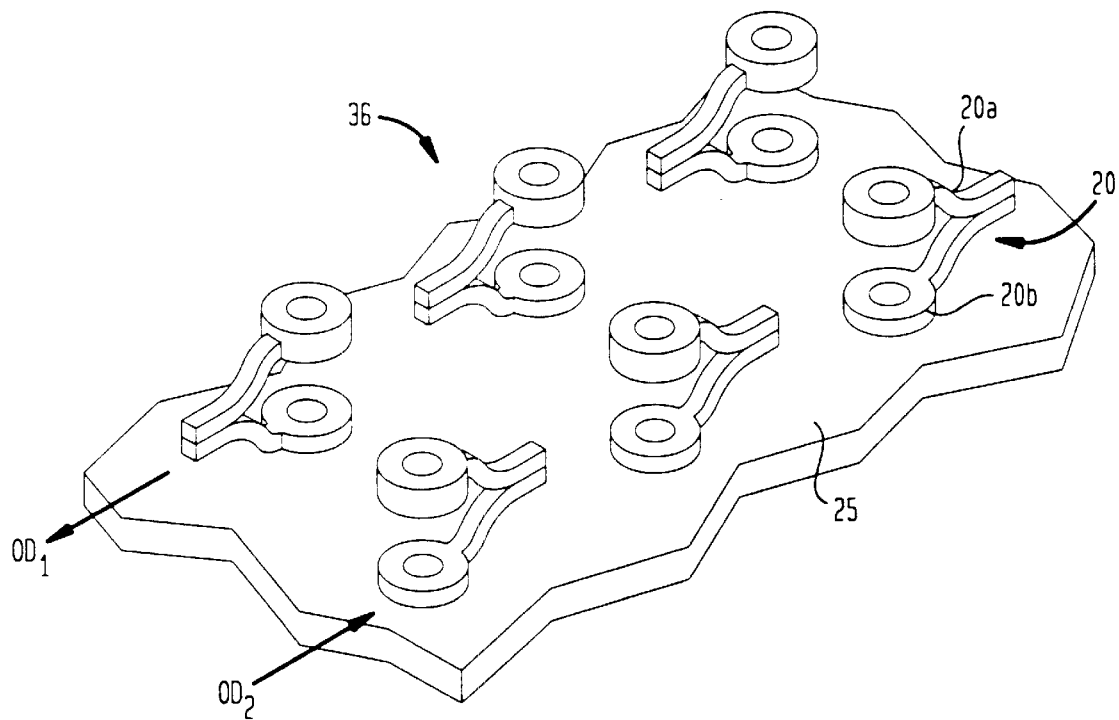
FIG. 9 is a partial perspective view of a microelectronic assembly according to one embodiment of the invention, with the first microelectronic element removed for clarity.

In one aspect of the invention, the horizontal offset direction OD of lead elements 20 may be varied from lead element to lead element in order to reduce stresses placed on the microelectronic elements during the lead-forming process. For example, a microelectronic assembly 36 has rows of lead elements 20 with alternating offset directions $OD_1$, $OD_2$ (FIG. 9). By placing lead elements having opposite offset directions adjacent to one another, forces generated by bending the leads, that would otherwise tend to shift the microelectronic elements with respect to one another in a horizontal plane, are substantially canceled.

Figure 10:
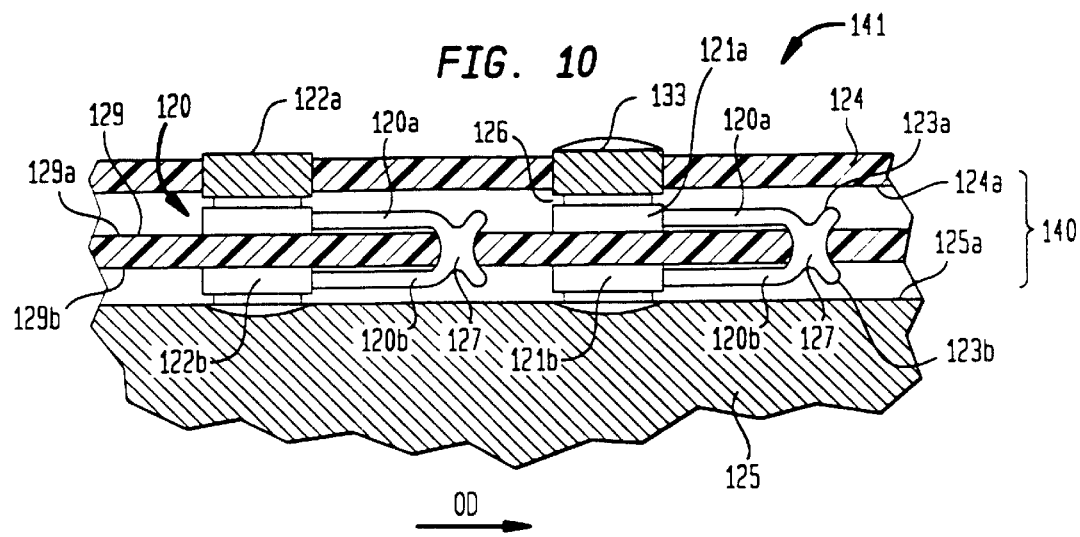
FIG. 10 is a partial cross-sectional view of a microelectronic assembly including a connector element according to one embodiment of the invention.

In another embodiment of the invention, a "floating" dielectric sheet 129 (FIG. 10) initially supports the lead elements 120 to form a connector element 140. Each lead element has a first, elongated, flexible lead 120a initially disposed on a first primary surface 129a of the dielectric sheet 129, and a second, elongated, flexible lead 120b initially disposed on a second primary surface 129b of the dielectric sheet. The leads are releasably attached to the dielectric sheet 129. The leads may be formed from the same materials as discussed above.

The tip end 123a of the first lead and the tip end 123b of the second lead are electrically and mechanically connected by bonding or by forming as an integral unit. In one embodiment, the dielectric sheet 129 has a plurality of vias 127 containing electrically conductive material, and the tip ends 123a and 123b are connected therethrough. The conductive material within the via 127 may be formed during the deposition and etching processes used to form the leads 120a, 120b. For example, the connection may be formed by plating the interior of the via with copper. Alternatively, the tip ends 123a, 123b may be connected at an edge (not shown) of the dielectric sheet 129.

Figure 12:
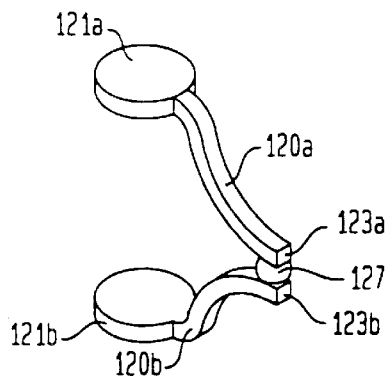
FIG. 12 is a perspective view of a first and second lead of the connector element of FIG. 8.

In the currently preferred embodiment, the first and second leads 120a, 120b are straight in plan view, although other shapes, such as an S-curve or a U-shape, may be used. The terminal ends 121a, 121b of the first and second leads preferably have enlarged circular pads (FIG. 12) to facilitate bonding to the microelectronic elements.

The tip ends 123a, 123b of the leads 120a, 120b are offset from the terminal ends 121a, 121b in an offset direction OD parallel to the plane of the dielectric sheet 129. The offset direction of the first lead 120a is the same as the offset direction of the second lead 120b.

The terminal ends 121a, 121b of a given lead element 120 are formed on the dielectric sheet 129 in registry with each other. Each of the terminal ends 121a, 121b is coated with an electrically conductive bonding material applied in spots on the exposed surfaces of the terminal ends.

A microelectronic assembly 141 according to the invention comprises the connector element 140 and the first and second microelectronic elements 124, 125. The connector element 140, including a plurality of lead elements 120 and the dielectric sheet 129, is bonded to the first microelectronic element 124 by aligning and bringing into contact the terminal ends 121a of the first leads 120a with contacts 122a of the first microelectronic element 124. Bonding material on the terminal ends 121a is then actuated by heat, pressure or other means, bonding the terminal ends 121a to the contacts 122a.

The microelectronic element 124 may be a second dielectric sheet for later bonding to an additional microelectronic element (not shown). The second dielectric sheet is provided with vias 133, and contacts 122a extend through the vias 136 for electrical connection of the terminal ends 121a of the first leads 120a to the additional microelectronic element.

The connector element 140 is further bonded to a second microelectronic element 125 by aligning, contacting and bonding the terminal ends 121b of the second leads 120b with the contacts 122b of the second microelectronic element 125. Because the terminal ends 121a, 121b are releasably attached to the dielectric sheet 129, they maintain their relative positions to facilitate alignment and bonding.

While bonding of the connector element 140 to the first and second microelectronic elements 124, 125 may be performed sequentially, as described above, it is preferred that the bonding process be performed as a single operation.

In the case of a single operation, terminal ends 121a, 121b of the first and second leads are aligned with the respective contacts 122a, 122b of the microelectronic elements. Bonding material on all terminal ends is then actuated simultaneously.

A microelectronic assembly comprising the connector element 140 and the first and second microelectronic elements 124, 125, may be further processed by separating the microelectronic elements, thereby bending the lead elements 120 and displacing the first dielectric layer 129. The microelectronic elements 124, 125 are moved away from each other in a vertical direction normal to the offset direction OD by either mechanical means or by injecting a material between the facing surfaces 124a, 125a as described above. If a material is injected between the facing surfaces, vent holes (not shown) through the dielectric sheet 129 may be provided in order to allow the injected material to flow between the area bounded by the first microelectronic element 124 and the dielectric sheet 129, and the area bounded by the second microelectronic element 125 and the dielectric sheet 129. Further, the injected material may be injected into both gaps.

Figure 11:
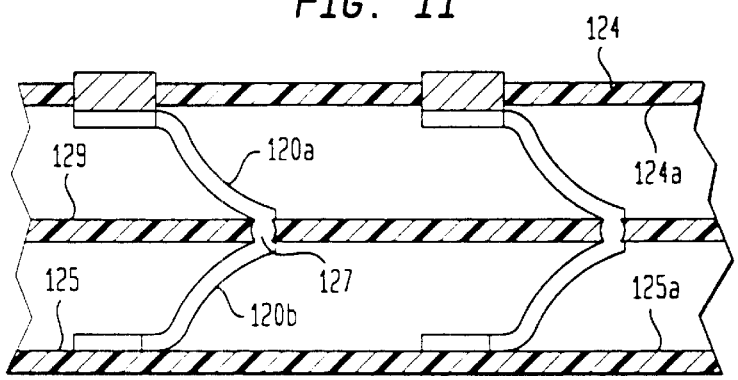
FIG. 11 is a partial sectional view of the microelectronic assembly and connector element of FIG. 7, after performing a method of processing according to one embodiment of the invention.

After displacement of the microelectronic elements 124, 125 away from each other (FIGS. 11, 12), each of the leads 120a, 120b has an S-shaped configuration and the leads are joined at their tip ends 123a, 123b. The S-shape permits the lead element 120 to deflect in both the horizontal and vertical directions in response to thermal changes and other influences on the microelectronic elements 124, 125. As the microelectronic elements are moved away from each other, the first dielectric layer 129 moves horizontally in the direction opposite the offset direction OD. The dielectric layer 129 remains at a position approximately half way between the facing surface 124a and the facing surface 125a.

Where the first microelectronic component 124 is a second dielectric sheet, it is preferred that an encapsulant such as silicon is injected between the facing surfaces 124a, 125a in order to separate the microelectronic elements and form the leads. The encapsulant provides a resilient backing for the second dielectric sheet 124, which facilitates the connection of the contacts 122a to another microelectronic element such as a circuit board (not shown). By individually providing resilient backing for each of the contacts 122a, the compliance of the encapsulant facilitates making contact between a vast number of contacts 122a and a vast number of contacts on the circuit board.

In another embodiment, the microelectronic element 124 may be an additional dielectric sheet (not shown) similar to dielectric sheet 129, having additional lead elements 120. In this case, a tip end of each lead element of one dielectric sheet is bonded to a tip end of a corresponding lead element of the adjacent dielectric sheet. By bonding together successive lead elements of successive dielectric sheets, and then bending the resulting lead element as described above, an accordion-shaped lead element may be formed.

Due to their linear configuration in plan view, the lead elements described with reference to FIGS. 7–12 may be densely distributed on a surface such as a connector element. As compared to a curved lead in a plan view such as an S-shaped or a U-shaped lead, the straight leads of the present invention offer greater extension in the vertical direction for a given occupied area in the horizontal plane. This advantage has considerable importance in the case of chips requiring hundreds of connections to external devices.

The lead elements, configurations and other aspects of the invention discussed herein may be used in the various processes and configurations discussed in U.S. Pat. No. 5,518,964. Merely by way of example, the present invention may be employed in the processing of an entire semiconductor wafer, or in the assembly of plural chips, or in processing a single chip, all as described in the '964 patent. The present invention may also be utilized in conjunction with the inventions disclosed in U.S. patent application Ser. No. 08/532,528, filed Sep. 22, 1995, application Ser. No. 08/678,808, filed Jul. 12, 1996, and application Ser. No. 08/653,016, filed May 24, 1996, the disclosures of which are also incorporated by reference herein.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A microelectronic lead element comprising: an elongated first leg having a surface releasably attached to a substrate, said first leg having a first end and a second end, an elongated second leg having a surface releasably attached to a substrate, said second leg having a first end and a second end, said first end of said first leg arranged adjacent said first end of said second leg, and a body of conductive material adapted for electrically connecting said first ends of said first and second legs together, said first and second legs extending away from their respective first ends and said body of conductive material in a common direction, wherein movement of said second ends relative to each other in a vertical direction relative to said substrate will cause flexure of said first and second legs in opposite directions upon release from said substrate.

2. The microelectronic element of claim 1, wherein said substrate to which said first leg is releasably attached comprises a first microelectronic element and said substrate to which said second leg is releasably attached comprises a second microelectronic element.

3. The microelectronic element of claim 2, wherein said first and second microelectronic elements each include a dielectric sheet to which said first and second legs are respectively releasably attached.

4. The microelectronic element of claim 3, wherein each of said dielectric sheets include a via respectively receiving said second ends of said first and second legs.

5. The microelectronic element of claim 2, wherein said first and second legs are vertically aligned overlying each other.

6. The microelectronic element of claim 5, wherein said body of conductive material comprises bonding material.

7. The microelectronic element of claim 2, wherein said first ends of said first and second legs and said second ends of said first and second legs are arranged overlying each other in vertical alignment.

8. The microelectronic element of claim 1, wherein said substrate to which said first leg is releasably attached and said substrate to which said second leg is releasably attached comprises a common substrate having spaced apart top and bottom surfaces.

9. The microelectronic element of claim 8, wherein said first and second legs are releasably attached to said top surface of said common substrate in parallel spaced apart arrangement.

10. The microelectronic element of claim 9, wherein said body of conductive material is releasably attached to said top surface of said common substrate and connected to the first ends of said first and second legs.

11. The microelectronic element of claim 10, wherein the second end of one of said legs is permanently connected to a contact on said top surface of said common substrate.

12. The microelectronic element of claim 8, wherein said common substrate comprises a dielectric sheet.

13. The microelectronic element of claim 12, wherein said first and second legs are arranged in non-collinear alignment with respect to each other on said top surface of said common substrate.

14. The microelectronic element of claim 8, wherein said first leg is releasably attached to said top surface of said common substrate and said second leg is releasably attached to said bottom surface of said common substrate.

15. The microelectronic element of claim 14, wherein said body of conductive material extends through a via within said common substrate between said top and bottom surfaces, said base ends of said first and second legs being respectively connected to said body of conductive material at said top and bottom surfaces of said common substrate.

16. The microelectronic element of claim 15, wherein said common substrate comprises a dielectric sheet.

17. The microelectronic element of claim 15, wherein said first and second legs are vertically aligned overlying each other with said common substrate positioned therebetween.

18. A microelectronic lead element comprising: a first strip-like leg having a surface releasably attached to a first substrate, said first strip-like leg having a tip end and a first terminal end permanently connected to said first substrate, and a second strip-like leg having a surface releasably attached to a second substrate, said second strip-like leg having a tip end and a second terminal end permanently connected to said second substrate, the tip ends of said legs being electrically connected together, wherein movement of said first terminal end relative to said second terminal end in a vertical direction will cause flexure of said legs in opposite directions upon release of said legs from said first and second substrates.

19. The microelectronic element of claim 18, wherein said tip ends are electrically connected by bonding material.

20. The microelectronic element of claim 18, wherein said first and second substrates comprise first and second microelectronic elements.

21. The microelectronic element of claim 20, wherein said first and second microelectronic elements comprise dielectric sheets.

22. The microelectronic element of claim 21, wherein each of said dielectric sheets include a via respectively receiving a terminal end of said first and second legs.

23. The microelectronic element of claim 18, wherein said first and second legs are vertically aligned overlying each other.

24. The microelectronic element of claim 18, wherein said tip ends of said first and second legs and said terminal ends of said first and second legs are arranged overlying each other in vertical alignment.

25. A combination of a microelectronic lead element connecting first and second microelectronic elements, said lead element comprising: a strip-like first lead having a surface releasably attached to a first microelectronic element, said first lead having a terminal end permanently connected to said first microelectronic element and a tip end releasably attached to said first microelectronic element, a strip-like second lead having a surface releasably attached to a second microelectronic element, said second lead having a terminal end permanently connected to said second microelectronic element and a tip end releasably attached to said second microelectronic element, said first microelectronic element facing said second microelectronic element in spaced apart relationship with said first and second leads disposed therebetween with said leads arranged in vertical alignment with respect to each other, bonding material electrically connecting said tip ends of said first and second leads together, wherein movement of said terminal ends relative to each other in a vertical direction will cause flexure of said leads in opposite directions upon release of said leads from said first and second microelectronic elements while said terminal ends remain permanently connected to said first and second microelectronic elements.

26. The combination of claim 25, wherein said first microelectronic element comprises a first dielectric sheet.

27. The combination of claim 26, wherein said second microelectronic comprises a second dielectric sheet.

28. The combination of claim 26, wherein said first dielectric sheet includes a via receiving said terminal end of said first lead.

29. The combination of claim 28, wherein said terminal end within said via is connected to a contact on said first microelectronic element.

30. The combination of claim 27, wherein said second dielectric sheet includes a via receiving said terminal end of said second lead.

31. The combination of claim 30, wherein said terminal end within said via is connected to a contact on said second microelectronic element.

32. The combination of claim 25, wherein said tip ends of said first and second legs and said terminal ends of said first and second legs are arranged overlying each other in vertical alignment.

* * * * *

UNITED STATES PATENT AND TRADEMARK OFFICE
CERTIFICATE OF CORRECTION

PATENT NO. : 6,570,101 B2  
DATED : May 27, 2003  
INVENTOR(S) : Thomas H. DiStefano and John W. Smith It is certified that error appears in the above-identified patent and that said Letters Patent is hereby corrected as shown below:

<u>Title page,</u>  
Item [75], Inventors, "Di Stefano" should read -- DiStefano --.

<u>Column 3,</u>  
Line 10, "have" should read -- having -- .

<u>Column 10,</u>  
Line 33, "half way" should read -- half-way --.

<u>Column 11,</u>  
Line 46, "include" should read -- includes --.  
Line 60, "comprises" should read -- comprise --.

<u>Column 12,</u>  
Line 49, "include" should read -- includes --.

<u>Column 13,</u>  
Line 17, after "microelectronic" insert -- element --.

Signed and Sealed this

Ninth Day of September, 2003

JAMES E. ROGAN  
*Director of the United States Patent and Trademark Office*